(12) United States Patent
Mo

(10) Patent No.: US 8,309,977 B2
(45) Date of Patent: Nov. 13, 2012

(54) ORGANIC LIGHT-EMITTING DIODE MODULE

(75) Inventor: Yao-An Mo, Tainan (TW)

(73) Assignee: Au Optronics Corporation, Hsinchu (TW)

( * ) Notice: Subject to any disclaimer, the term of this patent is extended or adjusted under 35 U.S.C. 154(b) by 2 days.

(21) Appl. No.: 13/052,112

(22) Filed: Mar. 21, 2011

(65) Prior Publication Data

US 2012/0086025 A1    Apr. 12, 2012

(30) Foreign Application Priority Data

Oct. 11, 2010  (TW) .............................. 99134601 A

(51) Int. Cl.
*H01L 29/18* (2006.01)
*H01L 33/00* (2010.01)

(52) U.S. Cl. ............ 257/88; 257/691; 257/692; 438/82; 438/116

(58) Field of Classification Search .................... 257/88, 257/691, 692; 438/82, 116
See application file for complete search history.

(56) References Cited

U.S. PATENT DOCUMENTS 6,995,035 B2 * 2/2006 Cok et al. ........................ 438/82

\* cited by examiner

*Primary Examiner* — Jarrett Stark
*Assistant Examiner* — Nicholas Tobergte
(74) *Attorney, Agent, or Firm* — Jianq Chyun IP Office

(57) ABSTRACT

An organic light-emitting diode (OLED) module includes a substrate, a bus line, an organic light-emitting device layer, a plurality of conductive elements, and at least one conductive wire. The bus line is configured on the substrate. The organic light-emitting device layer is configured on the substrate and electrically connected to the bus line. The conductive elements are configured on the substrate and electrically connected to the bus line. The conductive wire is configured next to the conductive elements and electrically connected to the conductive elements.

8 Claims, 3 Drawing Sheets

ORGANIC LIGHT-EMITTING DIODE MODULE

CROSS-REFERENCE TO RELATED APPLICATION

This application claims the priority benefit of Taiwan application serial no. 99134601, filed Oct. 11, 2010. The entirety of the above-mentioned patent application is hereby incorporated by reference herein and made a part of this specification.

BACKGROUND OF THE INVENTION

1. Field of the Invention

The invention generally relates to a light-emitting module, and more particularly relates to an organic light-emitting diode (OLED) module.

2. Description of Related Art

An organic electroluminescence display is a self-emissive display. The organic electroluminescence display has the advantages of no viewing angle restriction, low production costs, high response speed (at least one hundred times the response speed of a liquid crystal display), low power consumption, a direct current driving function applicable to a portable device, a wide operating temperature range, light weight, and the ability to be miniaturized together with the hardware. Therefore, the organic electroluminescence device has great potential for development, and is expected to be the new flat panel display in the next generation.

The organic electroluminescence display is composed of two bus lines and an organic light-emitting layer configured between the two bus lines. Generally, the lower bus line is made of a transparent conductive material, such that light generated by the organic light-emitting layer can be transmitted out of the lower bus line. However, the greater the distance from the organic light-emitting layer to an external electrode, the greater the voltage drop-out caused by resistance. This is because the long conductive wire connected between the external electrode and the organic light-emitting layer leads to an increase in the resistance. As such, the less the voltage across the organic light-emitting layer, the lower the luminance.

Based on the above, when the organic electroluminescence display is developed to have an increasing size, the voltage drop-out difference among various regions on the organic light-emitting layer becomes apparent. Thus, the light-emitting uniformity of the display is poor.

The conventional solution to the aforesaid issue often refers to expansion of the cross-section area of the bus line for increasing the amount of power transmission. Alternatively, the contact positions between a flexible circuit board and a substrate can be increased, so as to increase the number of contacts for signal input. Nevertheless, the former solution may result in expansion of the substrate or reduction of the aperture ratio, while the latter solution may increase the volume of the flexible circuit board and the wire bonding costs. Consequently, the above-mentioned issue cannot be efficiently resolved.

SUMMARY OF THE INVENTION

The invention is directed to an OLED module that has constant voltage supply and thus can ensure uniformity of luminance.

The invention provides an OLED module that includes a substrate, at least one conductive wire, a bus line, an organic light-emitting device layer, and a plurality of conductive elements. The bus line, the organic light-emitting device layer, and the conductive elements are configured on the substrate. The organic light-emitting device layer and the conductive elements are electrically connected to the bus line, respectively. The conductive wire is configured next to the conductive elements and electrically connected to the conductive elements.

According to an embodiment of the invention, a connection portion between each of the conductive elements and the bus line has a rough surface.

According to an embodiment of the invention, the OLED module further includes a conductive adhesion layer that is configured between each of the conductive elements and the bus line.

According to an embodiment of the invention, the conductive elements are located at the peripheries of the substrate.

According to an embodiment of the invention, the organic light-emitting device layer includes a plurality of OLED units arranged in arrays. The conductive wire is connected to the conductive elements between any two of the OLED units through the substrate.

According to an embodiment of the invention, the conductive elements are conductive bumps or conductive protrusions substantially configured on the substrate.

According to an embodiment of the invention, each of the conductive elements is an elastic element substantially configured on the substrate and made of a conductive material.

According to an embodiment of the invention, a voltage drop-out of each of the conductive elements relative to the substrate is less than 10Ω after each of the conductive elements is electrically conducted.

Based on the above, in the previous embodiments of the invention, the OLED module provides the voltage source required by the organic light-emitting device layer through the conductive elements of the OLED module and the conductive wire that is electrically connected to the conductive elements. Thereby, the voltage can be constantly applied to each region of the organic light-emitting device layer. As such, the conventional issue of the voltage drop-out caused by the different locations of the bus line can be resolved, and different luminance efficacy of the organic light-emitting device layer caused by different voltages applied to the organic light-emitting device layer can be precluded.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
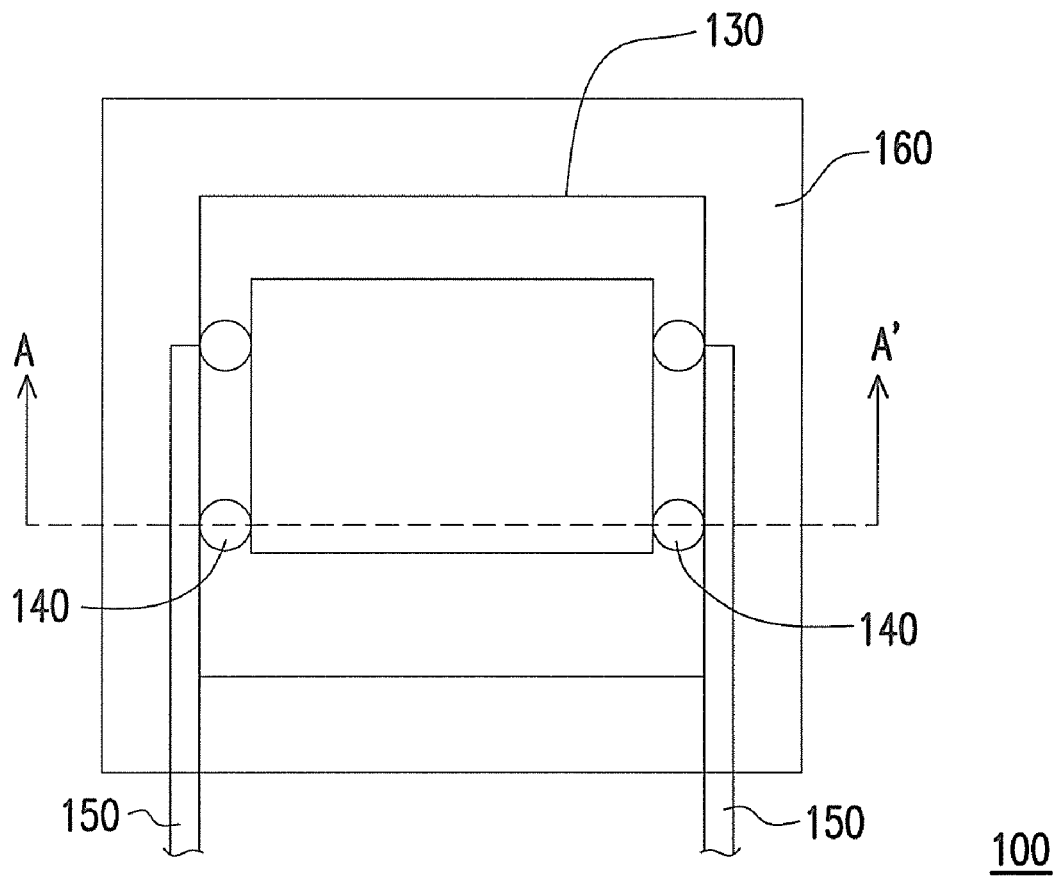
FIG. 1 is a top view illustrating an OLED module according to an embodiment of the invention.
Figure 2:
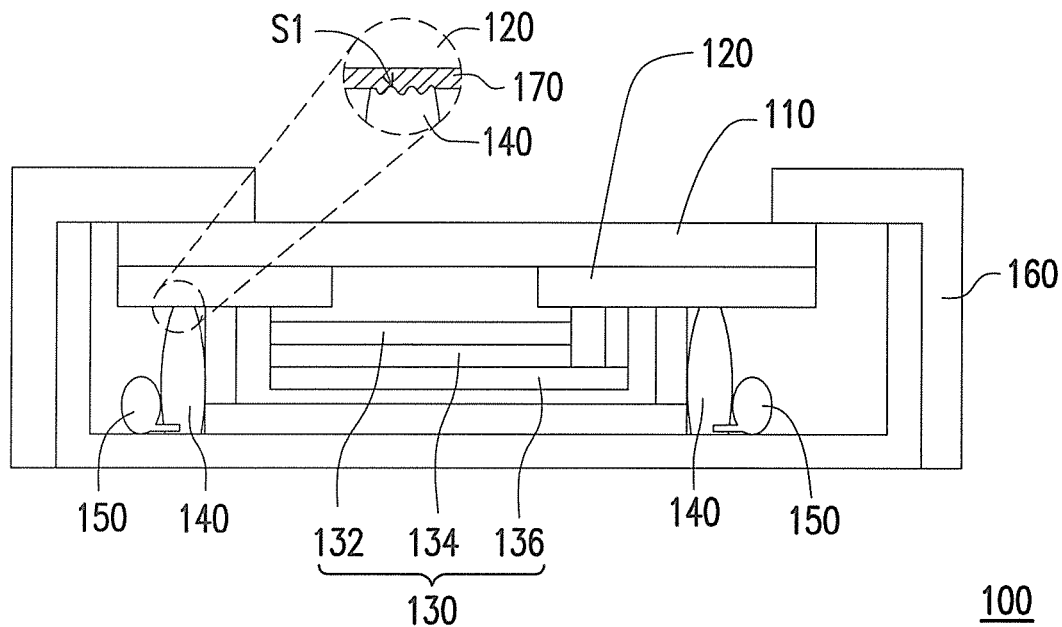
FIG. 2 is a cross-sectional view illustrating the OLED module depicted in FIG. 1 taken along a line A-A'.

FIG. 1 is a top view illustrating an OLED module according to an embodiment of the invention. FIG. 2 is a cross-sectional view illustrating the OLED module depicted in FIG. 1 taken along a line A-A'. With reference to FIG. 1 and FIG. 2, in this embodiment, the OLED module 100 includes a substrate 110, a bus line 120, an organic light-emitting device layer 130, a plurality of conductive elements 140, conductive wires 150 configured next to the conductive elements 140 and electrically connected to the conductive elements 140, and a frame 160 accommodating the above-mentioned components. The bus line 120, the organic light-emitting device layer 130, and the conductive elements 140 are configured on the substrate 110. The organic light-emitting device layer 130 and the conductive elements 140 are electrically connected to the bus line 120, respectively. In this embodiment, only two conductive wires 150 are depicted, which should however not be construed as a limitation to this invention. The OLED module 100 of this embodiment provides the voltage source required by the organic light-emitting device layer 130 through the conductive elements 140 configured on the substrate 110, such that voltages applied to each region of the organic light-emitting device layer 130 are almost the same, and that the luminance of each region of the organic light-emitting device layer 130 can be uniformized.

To be more specific, the substrate 110 is a transparent substrate, such as a transparent glass substrate or a transparent flexible substrate. The substrate 110 is mainly used to carry components of an organic electroluminescence device. In order to emit the light, which is generated by the organic electroluminescence device, from the substrate 110, the substrate 110 is made of a transparent material or a light-transmissive material. Generally, the organic electroluminescence device generating the light that is emitted from the substrate 110 is also referred to as a bottom emission organic electroluminescence device.

The organic light-emitting device layer 130 is located on the substrate 110. Particularly, the organic light-emitting device layer 130 includes a first electrode layer 132, a light-emitting layer 134, and a second electrode layer 136. The first electrode layer 132 is configured on the substrate 110, the light-emitting layer 134 is configured on the first electrode layer 132, and the second electrode layer 136 is configured on the light-emitting layer 134. The first electrode layer 132 is a transparent electrode layer and can be made of metal oxide, such as indium tin oxide (ITO), indium zinc oxide (IZO), and so forth. The light-emitting layer 134 is an organic light-emitting layer that can include a red organic light-emitting pattern, a green organic light-emitting pattern, a blue organic light-emitting pattern, or a light-emitting pattern of other colors generated by mixing light of various spectra (i.e., white, orange, purple, and so on). The second electrode layer 136 can be a metal electrode layer. According to other embodiments that are not depicted in the drawings, the organic light-emitting device layer 130 can further include an electron injection layer, a hole injection layer, an electron transporting layer, a hole transporting layer, and so on.

The conductive elements 140 of this embodiment are conductive bumps or conductive protrusions substantially configured at the peripheries of the substrate 110. When the OLED module 100 is assembled, the conductive elements 140 directly press the bus line 120; namely, the conductive elements 140 exert a pressing force on the bus line 120, and the pressing force is preferably greater than 50 g/cm$^2$. A connection portion between each of the conductive elements 140 and the bus line 120 has a rough surface S1 for increasing partial pressure on the conductive elements 140 and the substrate 110. In this embodiment, an embossment process can be performed on the surface of the conductive elements 140 to form the rough surface S1, while other processes for forming the rough surface S1 are also applicable in the invention.

Besides, the OLED module 100 of this embodiment further includes a conductive adhesion layer 170 which is formed by coating the space between the conductive elements 140 and the bus line 120 with the conducive adhesive, so as to enhance electrical connection between the conductive elements 140 and the bus line 120. Similarly, any method for enhancing the electrical connection between the conductive elements 140 and the bus line 120 is applicable in this embodiment.

On the other hand, after each of the conductive elements 140 is electrically conducted, a voltage drop-out of each of the conductive elements 140 relative to the substrate 110 must be less than 10Ω, such that the electric current passing the conducive elements 140 tends to be equalized. Thereby, the voltages applied on each region of the organic light-emitting device layer 130 are almost the same, and the OLED module 100 can have constant luminance efficacy.

Figure 3:
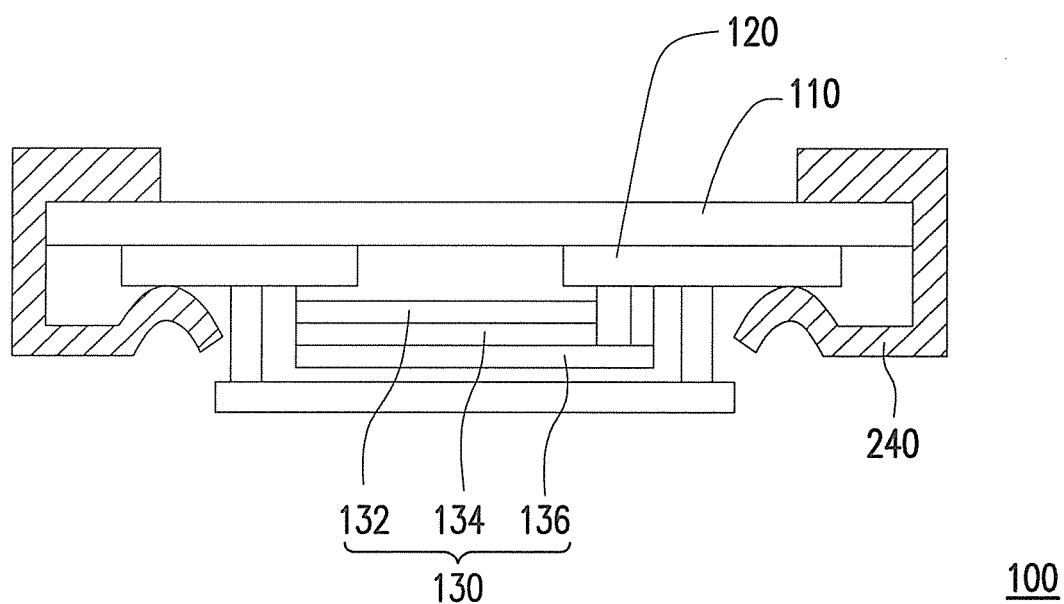
FIG. 3 is a cross-sectional view illustrating an OLED module according to another embodiment of the invention.

FIG. 3 is a cross-sectional view illustrating an OLED module according to another embodiment of the invention. As shown in FIG. 3, the difference between this embodiment and the previous embodiment lies in that each of the conductive elements 240 of this embodiment is an elastic element substantially configured on the substrate 110 and made of a conductive material. In addition, the conductive elements 240 can be electrically connected to the bus line 120 because the substrate 110 is clipped by the conductive elements 240. That is to say, in this embodiment, conductive clamping apparatuses configured on the substrate 110 can also serve as the conductive elements 240 in the OLED module 200, and the bus line 120 is electrically connected to the conductive elements 240, so as to supply the voltage source required by the organic light-emitting device layer 130.

It can be learned from the above embodiment that the conductive bumps, the conductive protrusions, or any elastic conductive element configured on the substrate 110 can be electrically connected to the bus line 120, so as to supply the voltage source required by the organic light-emitting device layer 130 and further equalize the voltages that are applied to each region of the organic light-emitting device layer 130.

Figure 4:
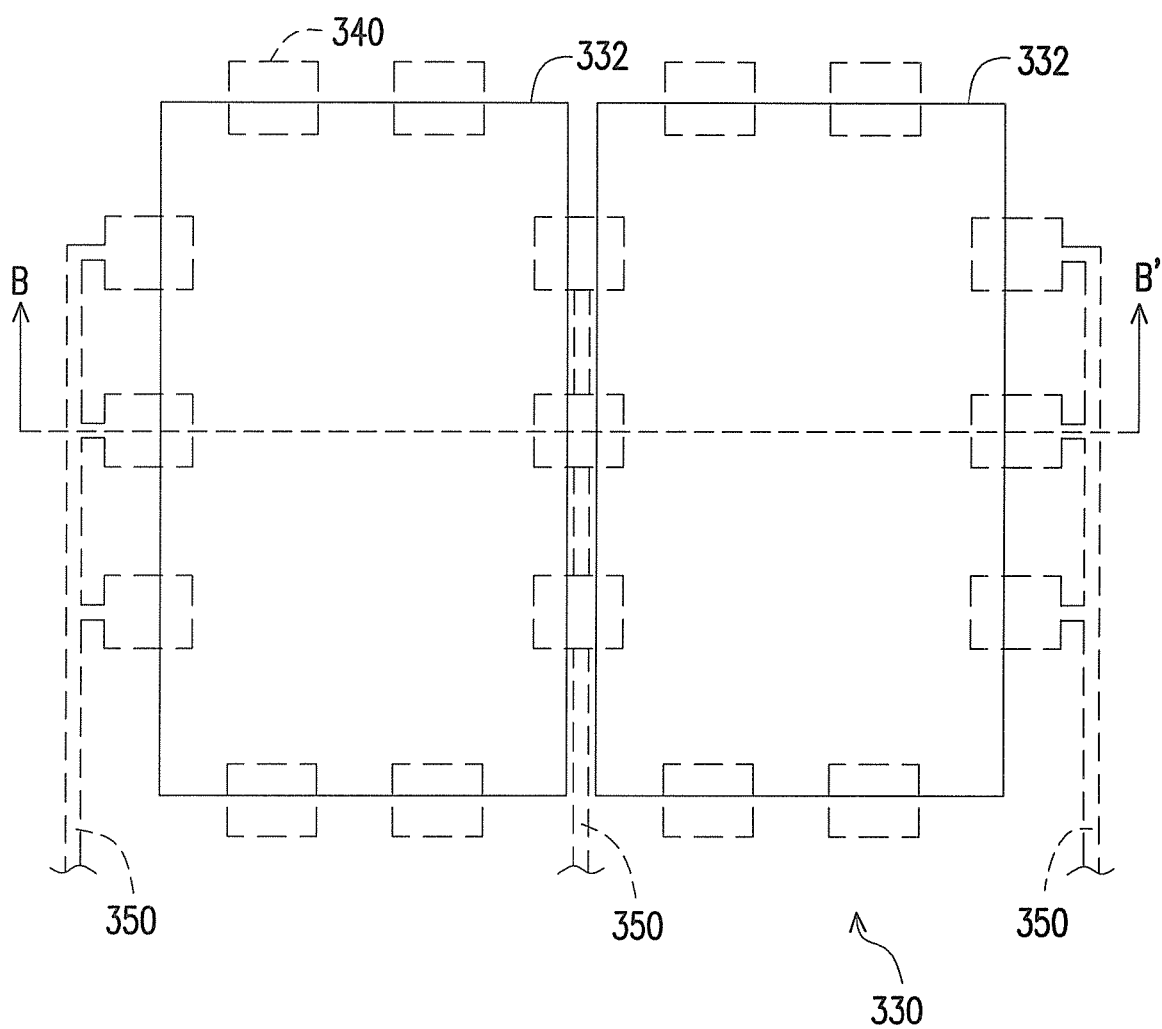
FIG. 4 is a top view illustrating an OLED module according to yet another embodiment of the invention.
Figure 5:
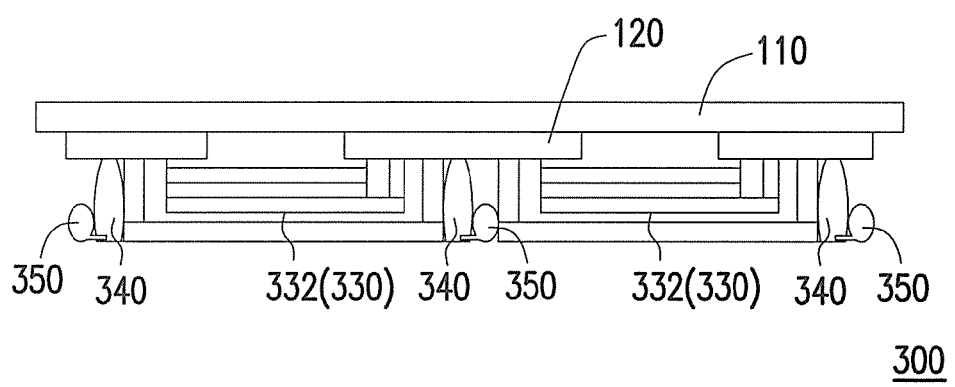
FIG. 5 is a cross-sectional view illustrating the OLED module depicted in FIG. 4 taken along a line B-B'.

FIG. 4 is a top view illustrating an OLED module according to yet another embodiment of the invention. FIG. 5 is a cross-sectional view illustrating the OLED module depicted in FIG. 4 taken along a line B-B'. With reference to FIG. 4 and FIG. 5, in this embodiment, the organic light-emitting layer 330 includes a plurality of OLED units 332 arranged in arrays, and only two of the OLED units 332 are depicted herein. The conductive wires 350 connect the conductive elements 340 (herein referred to as the conductive bumps or the conductive protrusions, for instance) between any two of the OLED units 332 through the substrate 110. Hence, no matter how the OLED units 332 are arranged, the OLED module 300 can supply the OLED units 332 with power through the conductive elements 340 on the substrate 110, and thereby the conventional negative impact on the voltages applied to the OLED units 332, which is caused by different locations of the bus line 120, can be prevented.

In light of the foregoing, the OLED module described in the previous embodiments of the invention can stabilize the voltages applied to the organic light-emitting layer by means of the conductive elements configured on the substrate. As such, power can be well supplied to the organic light-emitting device layer without being affected by the distance and the resistance of the bus line. Moreover, the conductive elements can be the conductive bumps, the conductive protrusions, or the elastic conductive clamping apparatuses configured on the substrate. In other words, the existing components of the OLED module are sufficient to achieve constant and stable voltage supply. As such, the voltage constantly and stably applied on each region of the OLED module can guarantee the uniform luminance efficacy of the OLED module.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An organic light-emitting diode module comprising:
   a substrate;
   a bus line configured on the substrate;
   an organic light-emitting device layer configured on the substrate and electrically connected to the bus line;
   a plurality of conductive elements configured on the substrate and electrically connected to the bus line, wherein a connection portion between each of the conductive elements and the bus line has a rough surface connecting to the bus line and a non-rough surface not connecting to the bus line, and a roughness of the rough surface is greater than a roughness of the non-rough surface; and
   at least one conductive wire configured next to the conductive elements and electrically connected to the conductive elements.

2. The organic light-emitting diode module as claimed in claim 1, wherein a connection portion between each of the conductive elements and the bus line has a rough surface.

3. The organic light-emitting diode module as claimed in claim 1, further comprising a conductive adhesion layer configured between each of the conductive elements and the bus line.

4. The organic light-emitting diode module as claimed in claim 1, wherein the conductive elements are located at peripheries of the substrate.

5. The organic light-emitting diode module as claimed in claim 1, wherein the organic light-emitting device layer comprises a plurality of organic light-emitting diode units arranged in arrays, and the at least one conductive wire is connected to the conductive elements between any two of the organic light-emitting diode units through the substrate.

6. The organic light-emitting diode module as claimed in claim 1, wherein the conductive elements are conductive bumps or conductive protrusions substantially configured on the substrate.

7. The organic light-emitting diode module as claimed in claim 1, wherein each of the conductive elements is an elastic element substantially configured on the substrate and made of a conductive material.

8. The organic light-emitting diode module as claimed in claim 1, wherein a voltage drop-out of each of the conductive elements relative to the substrate is less than $10\Omega$ after the each of the conductive elements is electrically conducted.

* * * * *